(12) United States Patent
Cox et al.

(10) Patent No.: US 7,472,650 B2
(45) Date of Patent: Jan. 6, 2009

(54) NICKEL ALLOY PLATED STRUCTURE

(75) Inventors: Harry David Cox, Rifton, NY (US); Hsichang Liu, Fishkill, NY (US); Nike Oluwakemi Medahunsi, Beacon, NY (US); Krystyna Waleria Semkow, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/865,170

(22) Filed: Oct. 1, 2007

(65) Prior Publication Data

US 2008/0070057 A1 Mar. 20, 2008

Related U.S. Application Data

(63) Continuation of application No. 10/908,883, filed on May 31, 2005, now Pat. No. 7,287,468.

(51) Int. Cl.
*B05C 17/06* (2006.01)
*B32B 3/24* (2006.01)
*B32B 15/20* (2006.01)

(52) U.S. Cl. .................. 101/128.21; 101/127; 428/596; 428/675

(58) Field of Classification Search ....................... None
See application file for complete search history.

(56) References Cited

U.S. PATENT DOCUMENTS 2,065,654 A 12/1936 Claisse
5,049,221 A 9/1991 Wada et al.
5,268,068 A * 12/1993 Cowell et al. ................. 216/12
5,813,331 A * 9/1998 Tan et al. ..................... 101/129
5,819,652 A * 10/1998 Utter et al. ............. 101/128.21
6,287,896 B1 9/2001 Yeh et al.
7,287,468 B2 * 10/2007 Cox et al. ............. 101/128.21
2006/0243700 A1 * 11/2006 Rippstein et al. .............. 216/12

FOREIGN PATENT DOCUMENTS

JP 58-114039 * 7/1983
JP 2001-130160 * 5/2001

* cited by examiner

*Primary Examiner*—John J Zimmerman
(74) *Attorney, Agent, or Firm*—Schmeiser, Olsen & Watts; Steven Capella

(57) ABSTRACT

A structure. The structure includes a layered configuration including a copper layer, a first layer, and a second layer. The first and second layers are disposed on opposite sides of the copper layer and are in direct mechanical contact with the copper layer. The first and second layers each include a same alloy of nickel and a metal consisting of cobalt, iron, copper, manganese, or molybdenum. A first region in the first layer extends completely through the first layer. A second region in the second layer extends completely through the second layer. A third region in the first layer extends completely through the first layer. The third region does not extend into any portion of the second layer. The first, second region, and third regions each include a photoresist or an opening such that photoresist or opening extends completely through the first, second, and first layer, respectively.

12 Claims, 8 Drawing Sheets

COBALT CONCENTRATION IN ALLOYS VS. COBALT CONCENTRATION IN SOLUTION

| COBALT CONCENTRATION IN SOLUTION (WEIGHT %) | COBALT CONCENTRATION IN ALLOY (WEIGHT %) |
|---|---|
| 1 | 3 |
| 3 | 12 |
| 4.5 | 18 |
| 5 | 21 |

*FIG. 6*

FRACTURE STRAIN OF ALLOY VS. COBALT CONCENTRATION IN SOLUTION

| COBALT CONCENTRATION IN SOLUTION (WEIGHT %) | FRACTURE STRAIN OF ALLOY (%) |
|---|---|
| 0 | 4.8 - 6.0 |
| 1 | 4.8 |
| 5 | 2.5 |
| 12 | 0.3 |

*FIG. 7*

NICKEL ALLOY PLATED STRUCTURE

This application is a Continuation of Ser. No. 10/908,883, filed May 31, 2005, issued on Oct. 30, 2007 as U.S. Pat. No. 7,287,468.

BACKGROUND OF THE INVENTION

1. Technical Field

The present invention relates generally to metal screening masks applicable to processing of semiconductors and packaging of electronic components. More specifically, the present invention relates to metal masks and their structure, wherein the structure includes a layered configuration comprising a copper layer sandwiched between layers of nickel-cobalt alloy.

2. Related Art

Metal masks are used as stencils to form patterns for many applications that include fabrication of wiring layers for organic and ceramic type substrates and deposition of solder pastes. For such applications, materials are transferred through openings in metal masks onto alumina and glass-ceramic green sheets and onto organic substrates. The metal masks are formed by an electroplating process and are called electroformed (EFM) masks. Unfortunately, the electroformed masks, which comprise a copper core that is electroplated with nickel, are limited in ultimate tensile strength (UTS).

Thus, there is a need for a mask that has a higher ultimate tensile strength than exists in the prior art.

SUMMARY OF THE INVENTION

The present invention provides a structure, comprising:

a layered configuration comprising a copper layer, a first layer, and a second layer, wherein the copper layer consists essentially of copper, wherein the first and second layers are disposed on opposite sides of the copper layer and are in direct mechanical contact with the copper layer, wherein the first and second layers each consist essentially of a same alloy of nickel and cobalt having a weight percent concentration of cobalt in a range of 3% to 21%, wherein a through hole in the layered configuration extends completely through the first layer, the copper layer, and the second layer, and wherein a first opening in the layered configuration extends completely through the first layer and does not extend into any portion of the second layer.

The present invention provides a method of forming a structure, comprising:

forming a layered configuration comprising a copper layer, a first layer, and a second layer, wherein the copper layer consists essentially of copper, wherein the first and second layers are disposed on opposite sides of the copper layer and are in direct mechanical contact with the copper layer, wherein the first and second layers each consist essentially of a same alloy of nickel and cobalt having a weight percent concentration of cobalt in a range of 3% to 21%, wherein a through hole in the layered configuration extends completely through the first layer, the copper layer, and the second layer, and wherein a first opening in the layered configuration extends completely through the first layer and does not extend into any portion of the second layer.

The present invention advantageously provides a mask that has a higher ultimate tensile strength than exists in the prior art.

BRIEF DESCRIPTION OF THE DRAWINGS

FIG. 6 is a table of cobalt weight percent concentration in a formed nickel-cobalt alloy versus cobalt weight percent concentration in an electroplating solution used to form the nickel-cobalt alloy, in accordance with embodiments of the present invention.

FIG. 7 is a table of fracture strain of a formed nickel-cobalt alloy versus cobalt weight percent concentration in an electroplating solution used to form the nickel-cobalt alloy, in accordance with embodiments of the present invention.

DETAILED DESCRIPTION OF THE INVENTION

The present invention provides a layered configuration comprising a copper layer sandwiched between layers of nickel-cobalt alloy having an ultimate tensile strength exceeding that of pure nickel, wherein the nickel-cobalt alloy may satisfy fracture strain constraints. For a force F applied to an area A of a sample, the ultimate tensile strength of the sample is defined as the maximum F/A that can be withstood by the sample without being fractured. Fracture strain is defined as the strain (i.e., elongation per unit length) resulting from application of F/A to the sample at the ultimate tensile strength of the sample. Since strain is a measure of ductility, which behaves oppositely to brittleness, it may be desirable in some embodiments for the value of fracture strain to have at least a minimum threshold value (e.g., 1%, 2%, 2.5%, 3%).

Figure 1A:
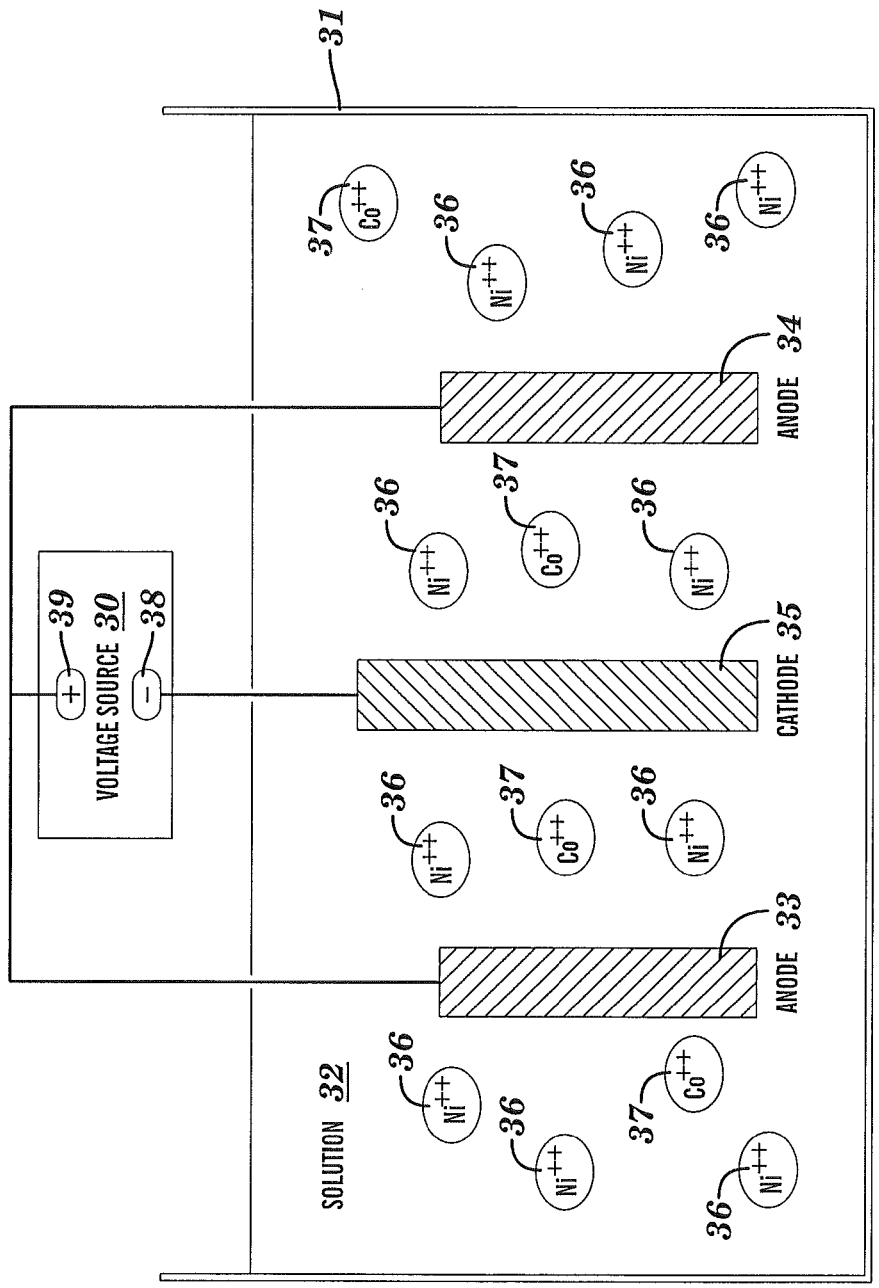
FIG. 1A depicts an apparatus for plating nickel-cobalt alloy layers on opposite sides of a copper layer, in accordance with embodiments of the present invention.

FIG. 1A depicts an apparatus for plating nickel-cobalt alloy layers on opposite sides of a copper layer, in accordance with embodiments of the present invention. In FIG. 1A, a vessel 31 contains a solution 32 comprising nickel ions ($Ni^{++}$) 36 and cobalt ions ($Co^{++}$) 37 therein. A voltage source 30 (e.g., power supply, battery, etc.) has a positive terminal 39 electrically connected to anodes 33 and 34 immersed in the solution 32, and has a negative terminal 38 electrically connected to a cathode 35 immersed in the solution 32. The cathode 35 is a copper layer that consists essentially of copper and is disposed between the anodes 33 and 34. The anodes 33 and 34 each independently comprise, or consist essentially of, nickel or a nickel-cobalt alloy. When the voltage source 30 is activated (i.e., turned on), the nickel ions 36 and the cobalt ions 37 migrate toward the cathode 35 (i.e., copper layer 35) and electroplate opposite sides 51 and 52 of the copper layer 35 to form the layered configuration 50 shown in FIG. 8. The preceding materials (nickel, nickel-cobalt alloy) of the anodes 33 and 34 serve to replenish the nickel ions 36 and cobalt ions 37 in the solution 32 as the nickel ions 36 and cobalt ions 37 are removed from the solution 32 to electroplate the copper layer 35.

In FIG. 1A, the solution 32 may comprise, inter alia, Sulfamex plating bath which is commercially available from Enthone-Omi. The Sulfamex plating bath is a nickel sulfamate bath serving as a source of the nickel ions modified by adding cobalt sulfamate solution to achieve a cobalt versus nickel weight percent concentration between 1% and 12% in the solution 32, which is equivalent to the cobalt sulfamate concentration between 3 and 38 g/l in the solution 32. The electroplating of nickel-cobalt alloy on opposite sides 51 and 52 of the copper layer 35 is performed at bath pH between 3.0 and 3.3, at a current of 30 mA/cm$^2$ and at a temperature of 50 deg. ° C.

Figure 8:
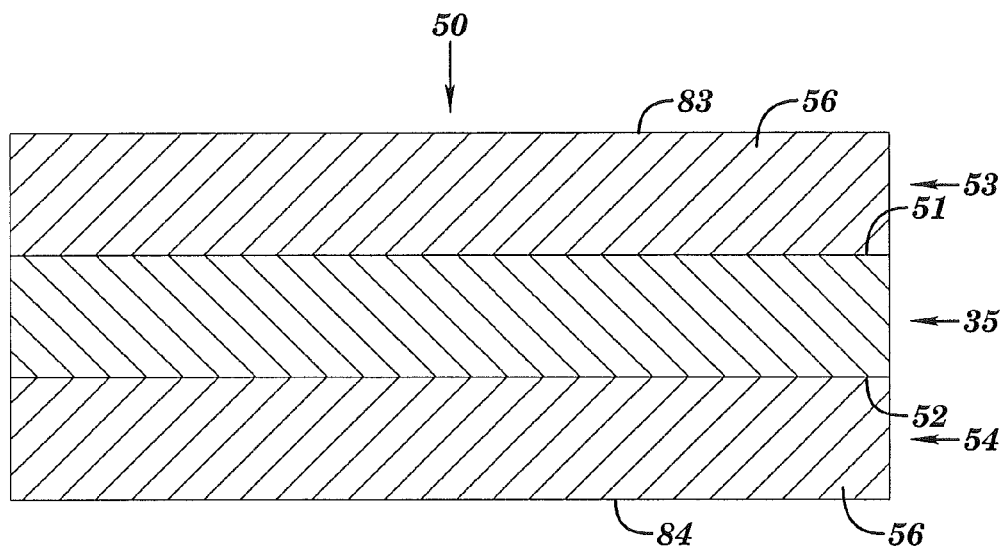
FIG. 8 depicts a cross-sectional view of layered configuration comprising a copper layer sandwiched between layers of nickel-cobalt alloy on opposite sides of the copper layer, in accordance with embodiments of the present invention.

FIG. 8 depicts a cross-sectional view of layered configuration 50 comprising a copper 35 layer sandwiched between a first layer 53 and a second layer 54 (each comprising nickel-cobalt alloy 56) on opposite sides of the copper layer 35, in accordance with embodiments of the present invention. The copper layer 35 is in direct mechanical contact with the first layer 53 and the second layer 54. The first layer 53 and the second layer 54 were formed from electroplating the copper layer 35 with the nickel ions 36 and the cobalt ions 37 in the solution 32 of FIG. 1A as described supra. The first layer 53 and the second layer 54 each consist essentially of a same nickel-cobalt alloy 56 having a weight percent concentration of cobalt that is a function of the weight percent concentration of cobalt in the solution 32 of FIG. 1A. The weight percent concentration of cobalt is with respect to the combination of nickel and cobalt for both the solution 32 of FIG. 1A and the first and second layers 53 and 54, respectively, of FIG. 8. The thickness of the layers 53 and 54 may be in the range, inter alia, between 10 and 100 micrometers (e.g., between 20 and 50 micrometers).

Figure 9:
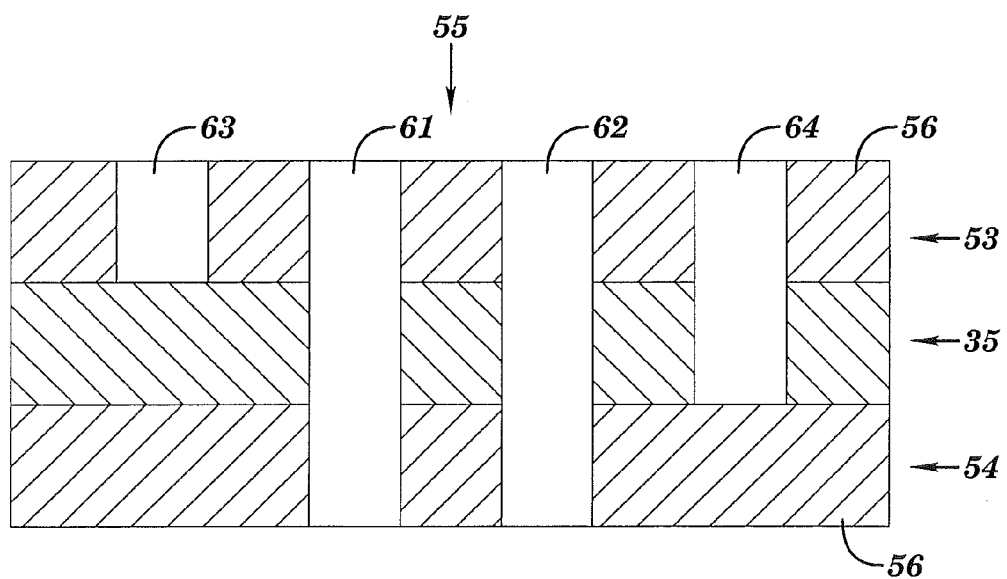
FIG. 9 depicts FIG. 8 after through holes and blind vias have been formed in the layered configuration to form a mask having a pattern, in accordance with embodiments of the present invention.

FIG. 9 depicts FIG. 8 after through holes 61 and 62, and blind vias 63 and 64, have been formed in the layered configuration 50 to form a mask 55 having a pattern, in accordance with embodiments of the present invention. The blind via 63 has been formed through the first layer 53. The blind via 64 has been formed through the first layer 53 and the copper layer 35. The pattern is defined by the distribution of holes (i.e., through holes 61 and 62 and blind vias 63 and 64) in the mask 55. The through holes 61 and 62, and blind vias 63 and 64, may be formed by selective etching using a photoresist pattern on the exposed surfaces on opposite sides 83 and 84 of the layered configuration 50 of FIG. 1A, wherein the photoresist pattern may be formed exposure to imaging radiation through a mask with transparent and non-transparent features. The radiation is characterized by a wavelength such as, inter alia, 193 nm or less (e.g., 157 nm) or any other imaging wavelength that is known to a person of ordinary skill in the art. Alternatively, the through holes 61 and 62 may be formed by mechanical or laser drilling. The blind via 64 may be formed by, inter alia, forming a blind via in the first layer 53 in the same manner as blind via 63 is formed, followed by selective chemical etching through the copper layer 35 to extend the blind via 64 through the copper layer 35 as shown in FIG. 9.

FIGS. 1B and 2-5 described an alternative embodiment for forming a mask analogous to the mask 55 of FIG. 9.

Figure 2:
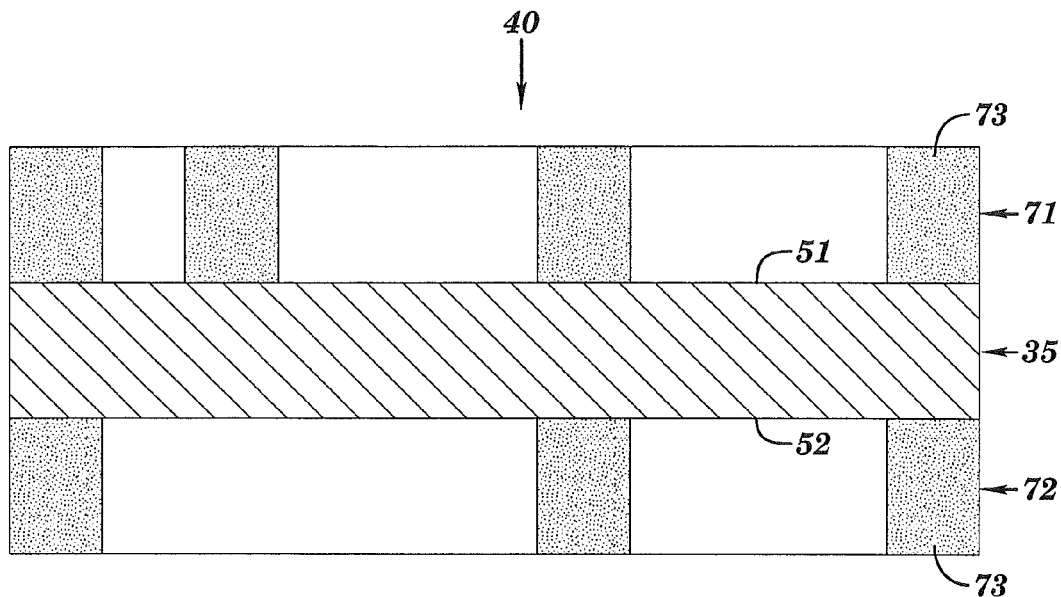
FIG. 2 depicts a cross-sectional view of a configuration comprising copper layer patterned with a photoresist layer on opposite sides of the copper layer, in accordance with embodiments of the present invention.

FIG. 2 depicts a cross-sectional view of a configuration 40 comprising a copper layer 35 with layers 71 and 72 on opposite sides 51 and 52, respectively, of the copper layer 35, in accordance with embodiments of the present invention. The layer 71 and 72 each comprise photoresist pattern characterized by a photoresist 73 distributed on sides 51 and 52 as shown. The photoresist pattern may be formed by exposure to imaging radiation through a mask with transparent and non-transparent features. The radiation is characterized by a wavelength such as, inter alia, 193 nm or less (e.g., 157 nm) or any other imaging wavelength that is known to a person of ordinary skill in the art.

Figure 1B:
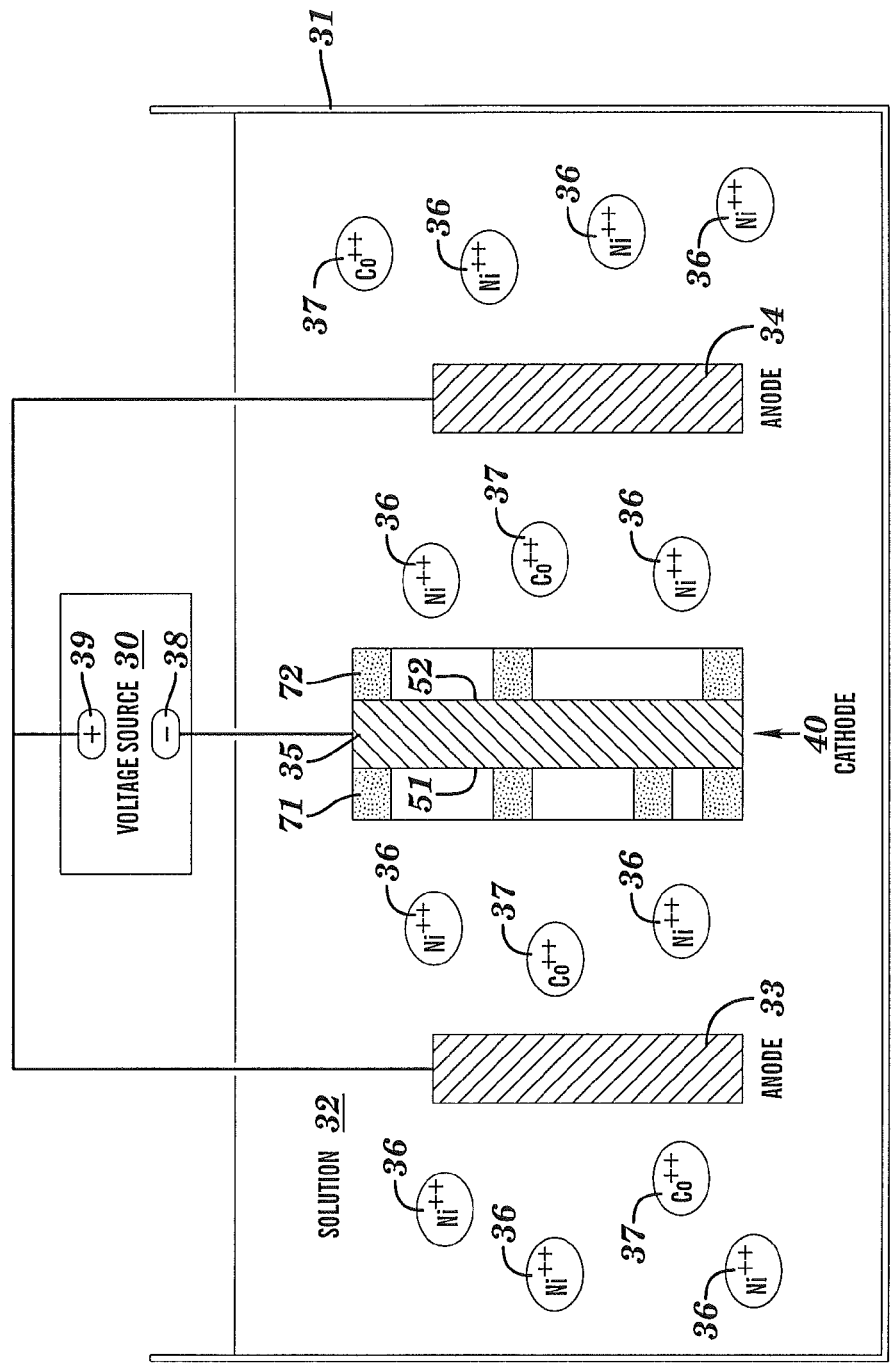
FIG. 1B depicts an apparatus for plating patterned nickel-cobalt alloy layers on opposite sides of a copper layer, in accordance with embodiments of the present invention.

FIG. 1B depicts an apparatus for plating patterned nickel-cobalt alloy layers on opposite sides of a copper layer, in accordance with embodiments of the present invention. FIG. 1B is the same as FIG. 1A with the exception of the copper layer 35 in FIG. 1A being replaced by the configuration 40 (see FIG. 2) in FIG. 1B. In FIG. 1B, the copper layer 35 of the configuration 40 serves as the cathode. Use of the configuration 40 enables formation of patterned nickel-cobalt alloy layers on opposite sides of a copper layer 35 in accordance with the pattern defined by the photoresist layers 71 and 72. In all other respects, the electroplating process of FIG. 1B is the same as the electroplating process of FIG. 1A described supra.

Figure 3:
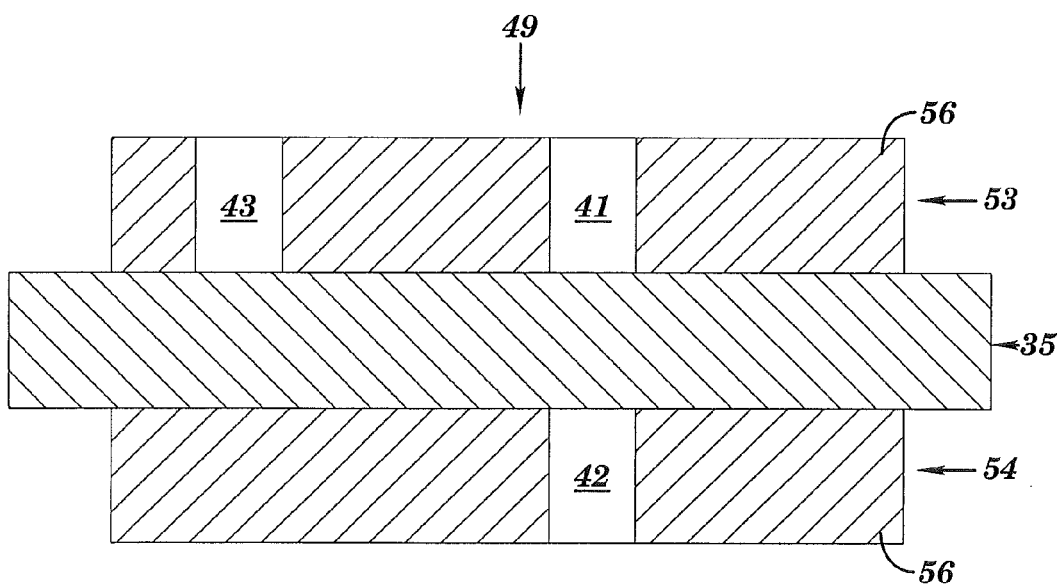
FIG. 3 depicts FIG. 2 after patterned nickel-cobalt layers have been electroplated over the opposite sides of the copper layer of FIG. 2 to form a layered configuration, in accordance with embodiments of the present invention.

FIG. 3 depicts FIG. 2 after patterned layers 53 and 54, each comprising nickel-cobalt alloy 56 in the patterning, have been electroplated over the opposite sides 51 and 52 of the copper layer 35 of FIG. 2 to form a layered configuration 49, in accordance with embodiments of the present invention. The electroplating of the nickel-cobalt alloy is performed in accordance with the electroplating technique of FIG. 1B. Thus the photoresist 73 of FIG. 2 serves to enable the electroplating to form the patterned nickel-cobalt alloy 56 and openings 41-43, in layers 53 and 54 of FIG. 3. The thickness of the layers 53 and 54 may be in the range, inter alia, between 10 and 100 micrometers (e.g., between 20 and 50 micrometers). The photoresist 73 (see FIG. 2) may be removed by using a resist stripping solution known to the industry (e.g., an alkaline solution containing potassium hydroxide).

Figure 4:
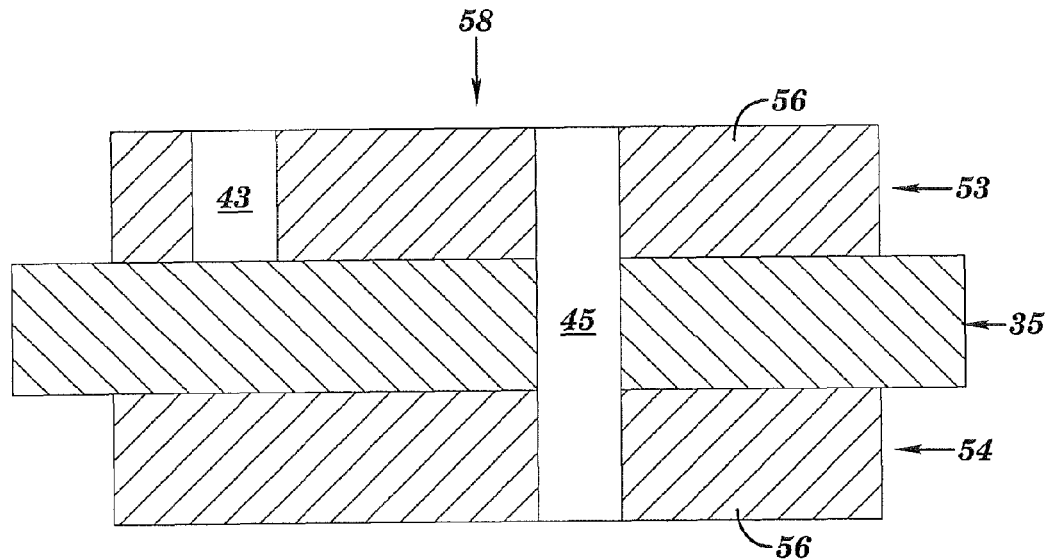
FIG. 4 depicts FIG. 3 after a hole has been formed in the copper layer to form a through hole in the layered configuration, in accordance with embodiments of the present invention.

FIG. 4 depicts FIG. 3 after a hole has been formed in the copper layer 35, said hole being aligned with openings 41 and 42 in layers 53 and 54, respectively, to form a through hole 45 in the layered configuration 49 and thus form a mask 58, in accordance with embodiments of the present invention. The hole aligned with openings 41 and 42 to form the through hole 45 may be formed by selective chemical etching of the copper layer 35. The opening 43 remains unetched in FIG. 4 with an additional photoprocessing step to protect the copper layer 35 under the opening 43 from being etched during etching of the through hole 45. In practice, an ammonium chloride and cupric chloride solution may be used as the etchant of the cooper.

Figure 5:
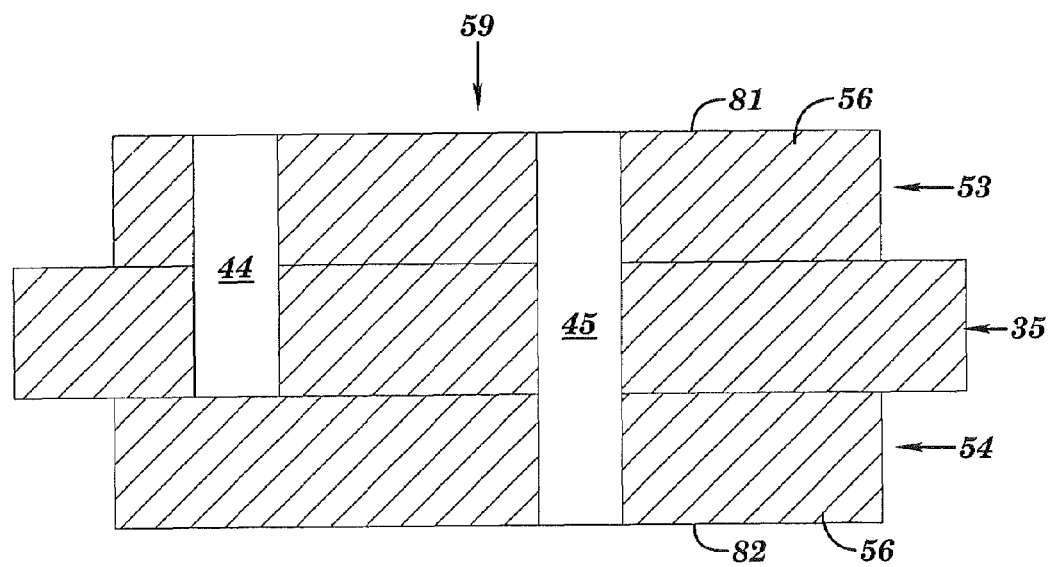
FIG. 5 depicts FIG. 3 after holes have formed in the copper layer to form a through hole in the layered configuration and a blind via through one of the nickel-cobalt layers and the copper layer, in accordance with embodiments of the present invention.

FIG. 5 depicts FIG. 3 after holes have formed in the copper layer, after selective two-sided etching of the copper core layer 35, to form the through hole 45 and a blind via 44 to form a mask 59, in accordance with embodiments of the present invention. The blind via 44 extends through the nickel-cobalt layer 53 and the copper layer 35. The mask 59 in FIG. 5 is obtained when the copper layer 35 is simultaneously etched from both sides 81 and 82 of the layered configuration 49 without any photoresist remaining on the copper layer 35.

FIG. 6 is a table of cobalt weight percent concentration in the formed nickel-cobalt alloy of layers 53 and 54 of FIG. 8 of FIG. 3 as a function of cobalt vs. nickel weight percent concentration in the electroplating solution 32 of FIG. 1A or FIG. 1B used to form the nickel-cobalt alloy, in accordance with embodiments of the present invention. The table of FIG. 6 shows that a range of 1% to 5% in the cobalt vs. nickel weight percent concentration in the solution 32 of FIG. 1A or FIG. 1B results in a cobalt weight percent concentration range of 3% to 21% in the resultant nickel-cobalt alloy of layers 53 and 54 of FIG. 8 or FIG. 3.

Addition of cobalt sulfamate to nickel sulfamate bath, as representing the solution 32 of FIGS. 1A and 1B, resulted in improved ultimate tensile strength (UTS) of a formed nickel-cobalt alloy. The baseline UTS for essentially pure nickel is about 55 kpsi, although the UTS for electroplated nickel is generally in a range of 50 to 70 kpsi. When cobalt is added to nickel to form the nickel-cobalt alloy, the UTS of the alloy increases as the weight percent concentration of cobalt in the electroplating solution increases. At 5% and at 7% weight percent concentration of cobalt in nickel-cobalt alloy the ultimate tensile strength of the deposit is about 110 and 190 kpsi, respectively. The UTS of the nickel-cobalt alloy of about 110 kpsi is about twice the UTS of pure nickel when the weight percent concentration of cobalt in the electroplating solution is about 5%. Thus, the cobalt weight percent in the electroplating solution used to form the nickel-cobalt alloy, or alternatively in the formed nickel-cobalt alloy, may be selected to be at a cobalt concentration at which the UTS of the alloy is at least 70 kpsi or at cobalt concentration at which the UTS of the alloy is at least twice the UTS of pure nickel.

FIG. 7 is a table of fracture strain of a formed nickel-cobalt alloy for different cobalt vs. nickel weight percent concentration in an electroplating solution used to form the nickel-cobalt alloy, in accordance with embodiments of the present invention. FIG. 7 shows that the fracture of the nickel-cobalt alloy decreases monotonically with increasing weight percent concentration of cobalt in the electroplating solution. The fracture strain of the nickel-cobalt alloys not less than 2.5% is selected for nickel-cobalt electroformed masks, corresponding to 5% cobalt vs. nickel by weight in the electroplating solution. Thus, the scope of the present invention includes a range of 1% to 5% in the weight percent concentration of cobalt vs. nickel in the electroplating solution, which corresponds to an associated range of 3% to 21% in the cobalt weight percent concentration in the formed nickel-cobalt alloy (see of FIG. 6). The scope of the present invention also includes a range of 3% to 4.5% in the weight percent concentration of cobalt vs. nickel in the electroplating solution, which corresponds to an associated range of 12% to 18% in the cobalt weight percent concentration in the formed nickel-cobalt alloy (see FIG. 6).

As described supra, FIG. 8 depicts a layered configuration 50 of the copper layer 35 sandwiched between layers 53 and 54 of nickel-cobalt alloy on opposite sides of the copper layer 35. The layered configuration 50 may be transformed into the mask 55 of FIG. 9 by forming through holes and blind vias in the layered configuration 50. Alternatively, the layered masks 58 and 59 of FIGS. 4 and 5, respectively, which are each analogous to the layered configuration mask 55 of FIG. 9, may be fabricated in accordance with the embodiment of FIGS. 1B and 2-5.

FIGS. 10-13 illustrate use of the mask 55 of FIG. 9 in conjunction with the screening of paste, in accordance with embodiments of the present invention. Alternatively, the mask 58 or 59 of FIG. 4 or FIG. 5, respectively, is similarly used in FIGS. 10-13 wherein the through holes 61 and 62 of FIG. 9 each correspond to through holes such as through hole 45 of FIG. 5 or FIG. 6, and wherein the blind vias 63 and 64 of FIG. 9 respectively correspond to blind via 43 of FIG. 4 and blind via 44 of FIG. 5.

Figure 10:
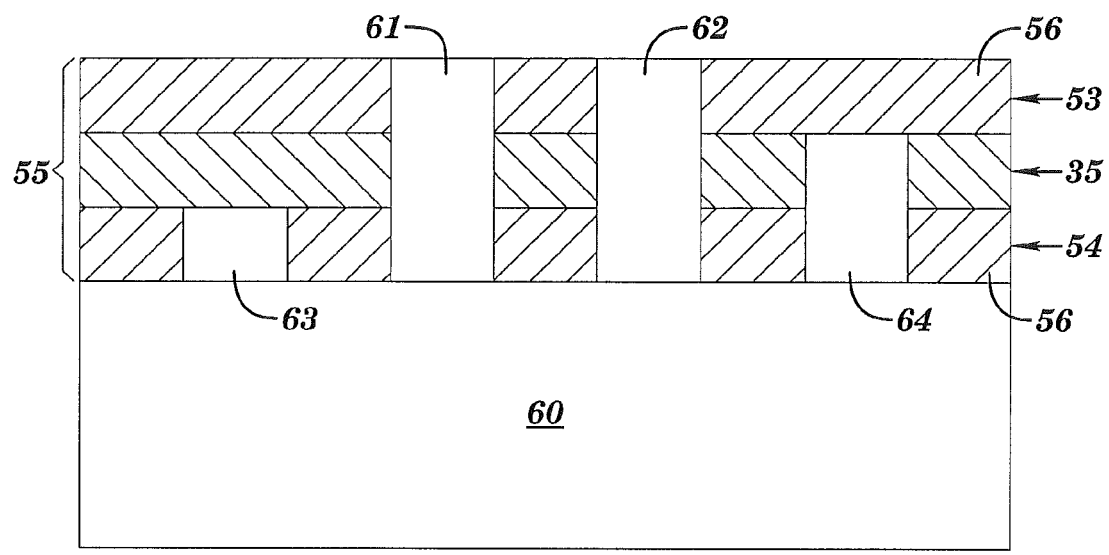
FIG. 10 depicts FIG. 9 after the mask has been disposed on a substrate, in accordance with embodiments of the present invention.

FIG. 10 depicts FIG. 9 after the mask 55 (or the mask 58 or 59 of FIG. 4 or 5, respectively, as represented by the mask 55) has been disposed on a substrate 60 after being turned upside down such that the blind vias 63 and 64 are no longer a blind vias in FIG. 10 but rather are opening in the mask 55 such that said openings 63 and 64 are covered by the substrate 60. The pattern of the mask 55 in FIG. 10 is defined by the distribution of through holes 61 and 62, and the openings 63 and 64, within the mask 55. Layer 54 of the mask 55 may be in direct mechanical contact with the substrate 60. The substrate 60 may comprise a dielectric material, electrically insulative material, etc., such as, inter alia, a ceramic material or an organic material.

Figure 11:
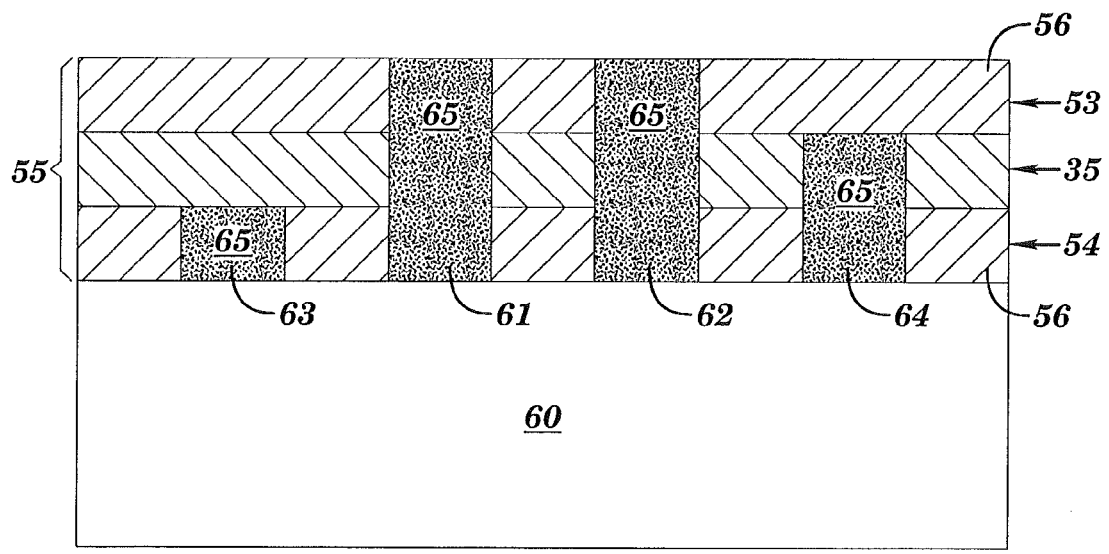
FIG. 11 depicts FIG. 10 after the through holes and blind vias of the mask have been filled with a paste, in accordance with embodiments of the present invention.

FIG. 11 depicts FIG. 10 after the through holes 61 and 62, and the openings 63 and 64, of the mask 55 have been filled with a paste 65. The paste 65 may comprise a metal powder (or other electrically conductive matter) and an organic material that binds the metal powder. The paste 65 in through holes 61 and 62 is in direct mechanical contact with the substrate 60.

Figure 12:
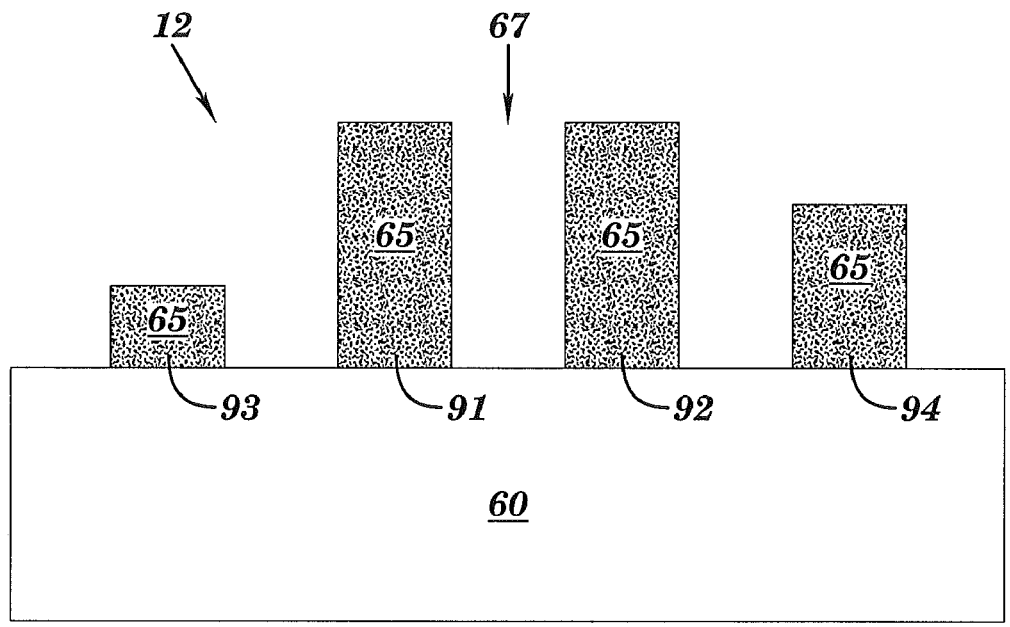
FIG. 12 depicts FIG. 11 in a view plane after the mask of FIG. 11 has been removed, leaving the paste distributed on the substrate according to the pattern of the mask of FIG. 10, in accordance with embodiments of the present invention.

FIG. 12 depicts FIG. 11 in a view plane 12 after the mask 55 of FIG. 11 has been removed, leaving the paste 65 distributed on the substrate 60 according to the pattern of the mask 55 of FIG. 10. In FIG. 12, the substrate 60 together with the pattern of paste 65 thereon is a "paste-patterned sheet" 67. Through holes 61 and 62 of FIG. 11 have become regions 91 and 92 of FIG. 12, and openings 63 and 64 of FIG. 11 have become regions 93 and 94 of FIG. 12, wherein the regions 91-94 each comprise the paste 65.

Figure 13:
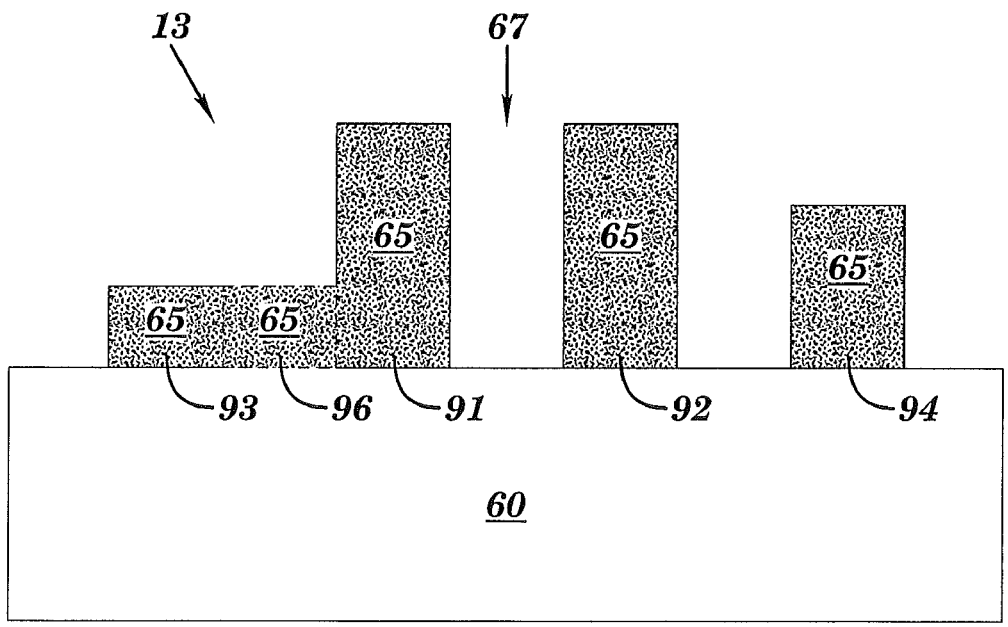
FIG. 13 depicts FIG. 11 in a view plane after the mask of FIG. 11 has been removed, leaving the paste distributed on the substrate according to the pattern of the mask of FIG. 10, wherein the view plane of FIG. 13 is parallel to the view plane of FIG. 12, in accordance with embodiments of the present invention.

FIG. 13 depicts FIG. 11 in a view plane 13 after the mask 55 of FIG. 11 has been removed, leaving the paste 65 distributed on the substrate 60 according to the pattern of the mask 55 of FIG. 10, wherein the view plane 13 of FIG. 13 is parallel to the view plane 12 of FIG. 12, in accordance with embodiments of the present invention. The view plane 13 in FIG. 13 shows a region 96 filled with the paste 65, wherein regions 93, 96, and 91 form a spatially continuous distribution of the paste 65.

A multiplicity of such paste-patterned sheets 67 of FIGS. 12-13 may be stacked, pressed, laminated, and sintered. In the sintering process, the organic material of the paste is removed, leaving conductive wiring layers within the overall substrate which has been formed from the substrate 60 of the individual paste-patterned sheets that have been stacked, pressed, laminated, and sintered. The conductive wiring layers within the overall substrate comprise the electrically conductive matter (e.g., metal) of the paste as electrically conductive lines within the overall substrate that remains after the sintering has been performed.

The mask 55 of FIG. 9 was described supra as being formed by the electroplating apparatus of FIG. 1A combined with the process of FIG. 9, and the analogous masks 58 and 59 of FIG. 4 and FIG. 5, respectively, was described supra as being formed by the electroplating apparatus FIG. 1B combined with the process of FIGS. 2-5. Nonetheless, the scope of the present invention includes any process known to a person of ordinary skill in the art for forming the mask 55 of FIG. 9, the mask 58 of FIG. 4, and the mask 59 of FIG. 5, such as: providing the copper layer 35 and the nickel-cobalt layers 53 and 54 of FIG. 8 in the form of sheets; laminating the layers 53, 35, and 54 together, and forming through holes and blind vias such as the through holes 61, 62 and the blind vias 63, 64 of FIG. 9.

While the description herein described a nickel-cobalt alloy that has a UTS exceeding the UTS of pure nickel for use in paste screening and photolithography applications, the scope of the present inventions includes other nickel alloys (e.g., an alloy of nickel and one of the following elements: iron, copper, manganese, molybdenum).

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure, comprising a layered configuration comprising a copper layer that includes copper, a first layer, and a second layer;
   wherein the first and second layers are disposed on opposite sides of the copper layer and are in direct mechanical contact with the copper layer;
   wherein the first and second layers each comprise a same alloy of nickel and a metal;
   wherein the metal consists of iron, copper, manganese, or molybdenum;
   wherein a first region in the first layer extends completely through the first layer;
   wherein a second region in the second layer extends completely through the second layer;
   wherein a third region in the first layer extends completely through the first layer and is separated from the first region by the alloy;
   wherein the first region is aligned directly above the second region in a first direction that is perpendicular to an interfacial surface between the first layer and the copper layer;
   wherein the third region does not extend into any portion of the second layer; and
   wherein the first region, the second region, and the third region each comprise a photoresist or an opening such that photoresist or the opening extends completely through the first layer, the second layer, and the first layer, respectively.

2. The structure of claim 1, wherein the metal consists of iron.

3. The structure of claim 1, wherein the metal consists of copper.

4. The structure of claim 1, wherein the metal consists of manganese.

5. The structure of claim 1, wherein the metal consists of molybdenum.

6. The structure of claim 1, wherein the third region does not extend into any portion of the copper layer.

7. The structure of claim 6,
   wherein the first region, the second region, and the third region each comprise the photoresist; and
   wherein the copper in the copper region separates the photoresist in the first region from the photoresist in the second region.

8. The structure of claim 6,
   wherein the first region, the second region, and the third region each comprise the opening; and
   wherein the copper in the copper region separates the opening in the first region from the opening in the second region.

9. The structure of claim 6,
   wherein the first region, the second region, and the third region each comprise the opening; and
   wherein a fourth region in the copper layer extends completely through the copper layer, and wherein a through hole consisting of the first region, the second region, and the fourth region extends completely through the first layer, the copper layer, and the second layer.

10. The structure of claim 9,
    wherein the structure further comprises a substrate;
    wherein the layered configuration is on the substrate and in direct mechanical contact with the substrate;
    wherein the through hole and the third opening are filled with paste that comprises metal powder and organic material that binds the metal powder; and
    wherein the paste in the through hole and the third opening is in direct mechanical contact with the substrate.

11. The structure of claim 1,
    wherein the third region extends completely through the copper layer;
    wherein the first region, the second region, and the third region each comprise the opening; and
    wherein a fourth region in the copper layer extends completely through the copper layer, and wherein a through hole consisting of the first region, the second region, and the fourth region extends completely through the first layer, the copper layer, and the second layer.

12. The structure of claim 11,
    wherein the structure further comprises a substrate;
    wherein the layered configuration is on the substrate and in direct mechanical contact with the substrate; and
    wherein the through hole and the third opening are filled with paste that comprises metal powder and organic material that binds the metal powder; and
    wherein the paste in the through hole and the third opening is in direct mechanical contact with the substrate.

* * * * *